(12) United States Patent
Yang et al.

(10) Patent No.: US 7,436,078 B2
(45) Date of Patent: Oct. 14, 2008

(54) LINE LAYOUT STRUCTURE OF SEMICONDUCTOR MEMORY DEVICE

(75) Inventors: Hyang-Ja Yang, Suwon-si (KR); Kang-Young Kim, Hwaseong-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 412 days.

(21) Appl. No.: 11/281,837

(22) Filed: Nov. 17, 2005

(65) Prior Publication Data
US 2006/0118958 A1  Jun. 8, 2006

(30) Foreign Application Priority Data
Nov. 18, 2004  (KR) ...................... 10-2004-0094435

(51) Int. Cl.
*H01L 23/58* (2006.01)
(52) U.S. Cl. ................ 257/903; 257/296; 257/909; 257/390; 257/758; 365/51; 365/63; 365/230.03

(58) Field of Classification Search ................. 257/261, 257/296, 300, 903, 905, 909, 390, 443, 758, 257/E27.007, E21.691, E21.678, E21.683, 257/E27.085, E21.66, E27.076; 365/63, 365/51, 230.03
See application file for complete search history.

(56) References Cited

U.S. PATENT DOCUMENTS

| | | | | |
|---|---|---|---|---|
| 5,936,875 | A * | 8/1999 | Kim et al. ................. | 365/51 |
| 6,445,041 | B1 | 9/2002 | Ishida | |
| 7,161,823 | B2 * | 1/2007 | Lee et al. ................. | 365/63 |
| 7,259,978 | B2 * | 8/2007 | Park et al. ................. | 365/63 |
| 7,379,318 | B2 * | 5/2008 | Yamauchi .................. | 365/104 |
| 2005/0286285 | A1 * | 12/2005 | Lee et al. ................. | 365/63 |
| 2006/0055045 | A1 * | 3/2006 | Park et al. ................. | 257/758 |
| 2006/0056218 | A1 * | 3/2006 | Park et al. ................. | 365/63 |

\* cited by examiner

*Primary Examiner*—Phuc T Dang
*Assistant Examiner*—Thanh Y Tran
(74) *Attorney, Agent, or Firm*—F. Chau & Associates, LLC.

(57) ABSTRACT

An apparatus including a trolling motor having at least one operational subsystem and the trolling motor also having an integral electronic controller for controlling the operational subsystem wherein the improvement comprises an integral electronic diagnostic system which will receive diagnostic information from the operational subsystem and will transmit the diagnostic information for reception externally of the trolling motor.

19 Claims, 9 Drawing Sheets

LINE LAYOUT STRUCTURE OF SEMICONDUCTOR MEMORY DEVICE

CROSS-REFERENCE TO RELATED APPLICATION

This application claims the benefit of Korean Patent Application No. 10-2004-0094435, filed Nov. 18, 2004, the disclosure of which is incorporated herein by reference in its entirety.

BACKGROUND OF THE INVENTION

1. Technical Field

The present invention relates to semiconductor memory devices, and more particularly, to a line layout structure of a semiconductor memory device.

2. Discussion of Related Art

Development of semiconductor memory device technologies has lead to high integration, high performance and low cost devices. Corresponding advancements in process techniques have lead to a generalization of multi-layered metal structures. The multi-layered metal structures allow for improved integration of chips but increase process costs. For this reason, memory manufacturers design products having metal structures of reduced size and cost, which may not include the multi-layered metal structures.

Typically, in static random access memories (SRAMs), word lines are formed of polysilicon having desirable resistance. Accordingly, it is common to adopt a structure in which word lines are formed of a metal layer having a small sheet resistance and in which main word lines disposed over bit line layers are tapped to the cell word line.

In a conventional line layout structure having a two or three-layer metal layer, word lines are disposed in an orthogonal direction to bit lines formed of a first metal line and main word lines and power lines or signal lines formed of a second metal line are disposed in the word line direction. Further, in the line layout structure having the three-layer metal layer, power lines and signaling lines may be formed of a third metal line.

Semiconductor memory devices having the conventional line layout are not suitable for realization of a high integration semiconductor memory device since the word lines; the power lines and the signal lines are formed as metal lines of the same layer.

Further, arrangement of the power lines is an important issue when metal lines of a multi-layered structure are disposed for high performance and high integration semiconductor memory devices. That is, a noise or a drop phenomenon occurring in the power supply may reduce the performance of the semiconductor memory device.

Further, the line layout structure having a two or three-layer metal structure is not desirable problems of increase in a delay time due to parasitic capacitance, resistance and the like between upper and lower metal layers. As a result, such problems become constraints in fabricating high performance and high integration semiconductor memory devices.

Therefore, a need exists for an enhanced line layout structure in the art.

SUMMARY OF THE INVENTION

According to an embodiment of the present invention, a line layout structure of a semiconductor memory device having static memory cells includes first metal lines disposed in a first direction on a cell array region to form first power lines for supplying power to the static memory cells, second metal lines disposed over the first metal lines in a second direction substantially perpendicular to the first metal lines to form second power lines for supplying power to the first power lines, third metal lines disposed over the second metal lines to form third power lines for supplying power to the second power lines, and fourth metal lines disposed over the third metal lines to form fourth power lines for supplying power to the third power lines.

According to an embodiment of the present invention, a line layout structure of a semiconductor memory device having static memory cells includes first metal lines disposed in a first direction on a cell array region to form first power lines for supplying power to the static memory cells, second metal lines disposed over the first metal lines in a second direction substantially perpendicular to the first metal lines to form second power lines for supplying power to the first power lines, third metal lines disposed over the second metal lines in the first direction to form third power lines for supplying power to the second power lines, and fourth metal lines disposed over the third metal lines in the second direction to form fourth power lines for supplying power to the third power lines.

The line layout structure may further comprise bit lines of the static memory cells formed of the first metal line. The bit lines and the first power lines may be disposed substantially in parallel with each other.

The line layout structure may further comprise main word lines formed of the second metal lines and connected to the word lines of the static memory cells. The main word lines and the second power lines may be disposed substantially in parallel with each other.

The main word lines may each include a main read word line and a main write word line. The second metal lines may be formed to be disposed in an order of the main read word line, the main write word line and the first power line. The second metal lines may be formed to be disposed in an order of the main write word line, the main read word line and the first power line.

The line layout structure may further comprise first signal lines formed of the third metal lines for conveying a signal for gaining access to the static memory cells. The first signal line and the third power line may be disposed substantially in parallel with each other.

The line layout structure may further comprise second signal lines formed of the fourth metal lines for conveying a signal for gaining access to the static memory cells, and the second signal lines and the fourth power lines may be disposed substantially in parallel with each other.

Preferably, the second power line is coupled to the first power line at an intersection therebetween, the third power line is coupled to the second power line at an intersection therebetween, and the fourth power line is coupled to the third power line at an intersection therebetween.

According to an embodiment of the present invention, a line layout structure of a semiconductor memory device having static memory cells includes first metal lines disposed substantially in parallel with bit lines of the static memory cells on a cell array region to form the bit lines and first power lines for supplying power to the memory cells. The line layout structure includes second metal lines disposed over the first metal lines substantially in parallel with main word lines coupled to word lines of the memory cells to form the main word lines and second power lines for supplying power to the memory cells, the second power lines being coupled to the first power lines at intersections therebetween. The line layout structure includes third metal lines disposed over the second metal lines to form first signal lines for conveying a signal for gaining access to the static memory cells and third power lines for supplying power to the memory cells, the third metal lines being disposed substantially perpendicular to the second metal lines and the third power lines being coupled to the second power lines at intersections therebetween. The line layout structure includes fourth metal lines disposed over the third metal lines to form second signal lines for conveying a signal for gaining access to the memory cells and fourth power lines for supplying power to the static memory cells, the fourth metal lines being disposed substantially perpendicular to the third metal lines, and the fourth power lines being coupled to the third power lines at intersections therebetween.

The first to fourth power lines may be coupled with each other through via layers between the respective power lines at an intersection therebetween.

Further, the via layers may be disposed substantially linearly when viewed in a vertical structure.

BRIEF DESCRIPTION OF THE DRAWINGS

The present invention will become more apparent to those of ordinary skill in the art by describing in detail preferred embodiments thereof with reference to the attached drawings in which:

FIG. 2b is a more detailed view showing power lines of FIG. 2a;

FIG. 2c is a schematic vertical sectional view showing a contact portion between the first metal line and the second metal line of FIG. 2a;

FIG. 3a is a schematic view showing that third metal lines are disposed substantially perpendicular to second metal lines at an upper portion of FIG. 2a;

FIG. 3b is a more detailed view of power lines of FIG. 3a;

FIG. 3c is a schematic vertical sectional view showing a contact portion between a second metal line and a third metal line of FIG. 3a;

FIG. 4a is a schematic view showing that fourth metal lines are disposed substantially perpendicular to third metal lines at an upper portion of FIG. 3a;

FIG. 4b is a more detailed view of power lines of FIG. 4a;

FIG. 4c is a schematic vertical sectional view showing a contact portion between a third metal line and a fourth metal line of FIG. 4a;

FIG. 5b is a vertical sectional view showing a vertical structure of FIG. 5a.

DETAILED DESCRIPTION OF PREFERRED EMBODIMENTS

The present invention may, however, be embodied in different forms and should not be construed as limited to embodiments set forth herein. Rather, embodiments are provided as teaching examples of the invention. Like numbers refer to like elements.

Figure 1:
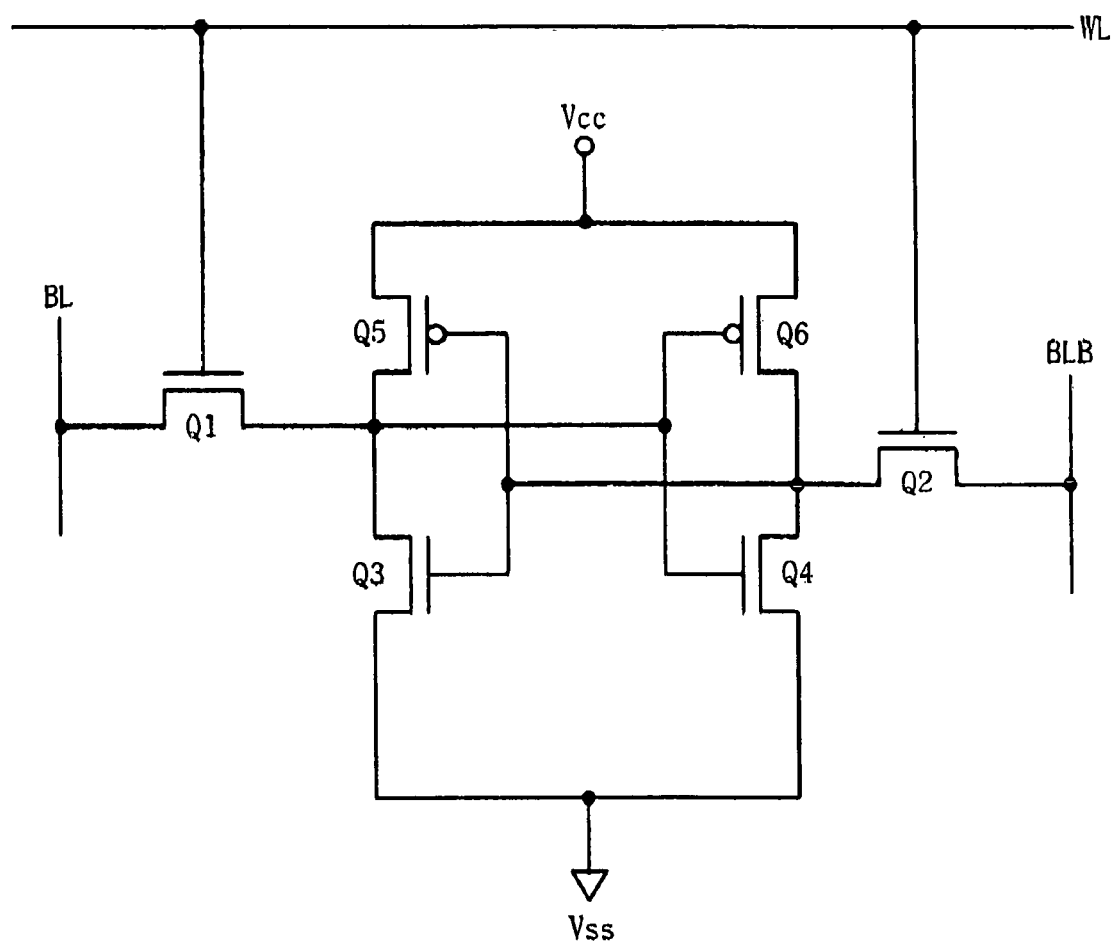
FIG. 1 is an equivalent circuit diagram of a unit memory cell of a typical static random access memory (SRAM)

FIG. 1 is an equivalent circuit diagram of a unit memory cell of a SRAM.

Referring to FIG. 1, the unit memory cell is composed of two access transistors Q1 and Q2, and one flip flop circuit (Q3, Q4, Q5 and Q6). The flip-flop circuit is composed of a pair of CMOS inverters. The inverter pair includes a first inverter composed of transistors Q3 and Q5 and a second inverter composed of transistors Q4 and Q6. The SRAM may be classified as a resistor type SRAM, a thin film transistor type SRAM or a full CMOS type SRAM, depending on a type of flip-flop (e.g., transistors Q5 and Q6). The full CMOS type SRAM has been used in applications needing reduced power supply voltage and increased speed.

In the SRAM having the above-described unit memory cell, bit lines BL and BLB are disposed in a first direction and the cell word line is disposed in a second direction, substantially perpendicular to the first direction, as shown in FIG. 1. Other semiconductor memory devices can have a similar arrangement.

Figure 2A:
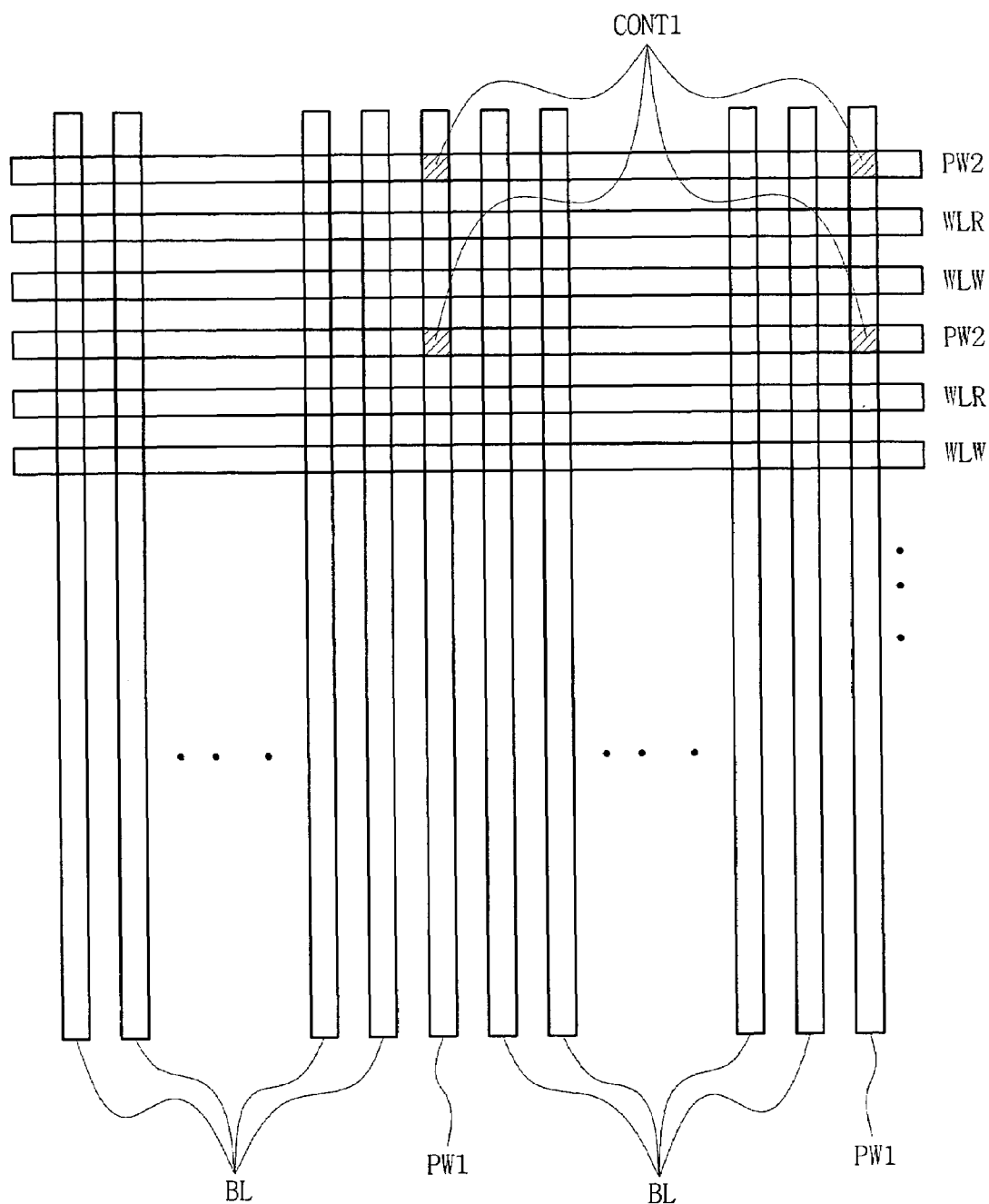
FIG. 2a is a schematic view showing that first metal lines and second metal lines are disposed in a memory cell array comprising a plurality of SRAM cells, one shown in FIG. 1.
Figure 2B:
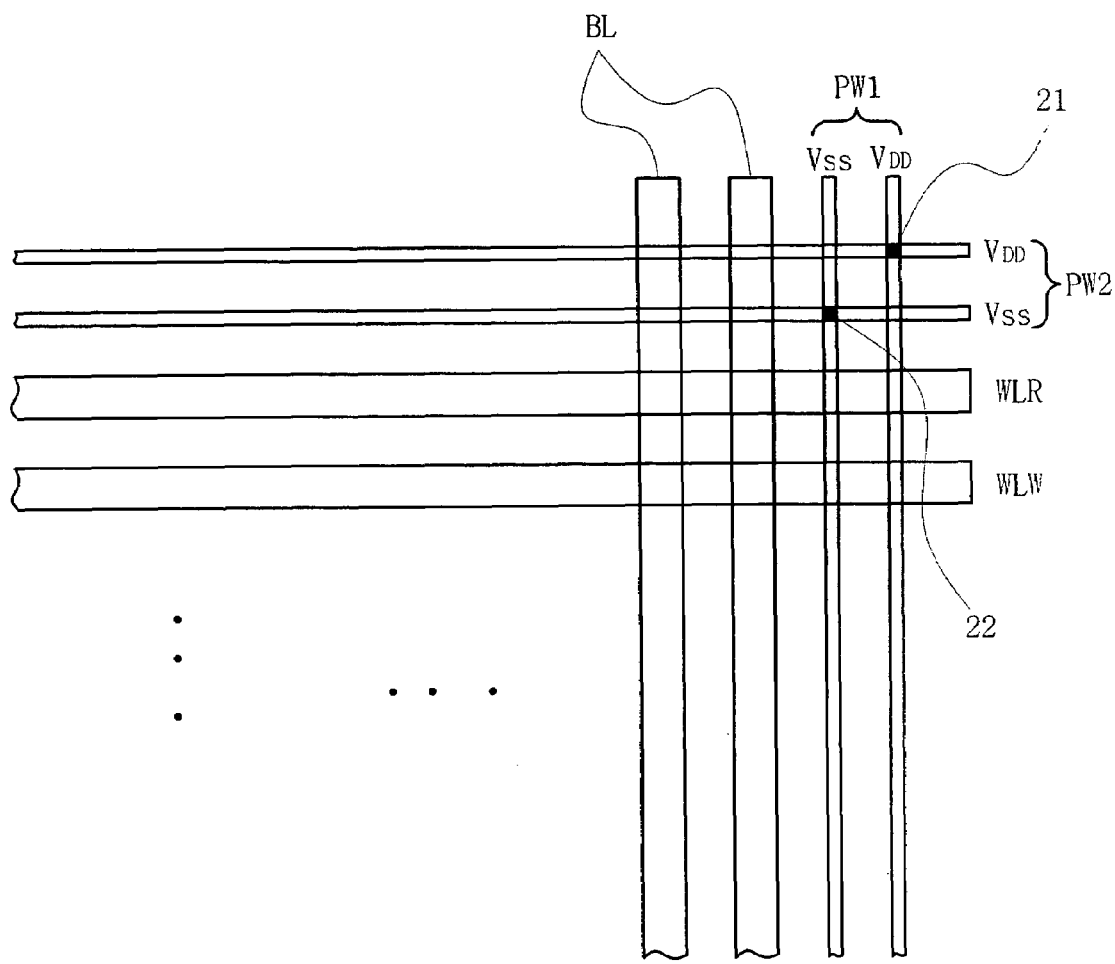
Figure 2C:
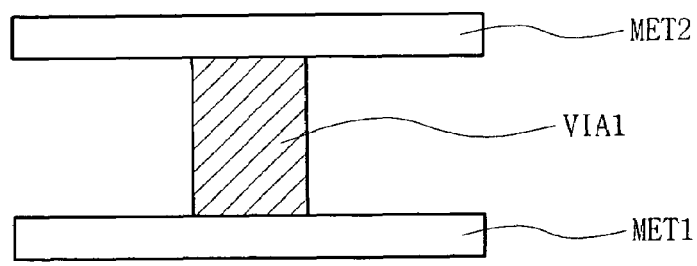

FIG. 2a is a schematic view showing first metal lines and second metal lines disposed in a memory cell array comprising a plurality of SRAM cells, for example, as shown in FIG. 1. FIG. 2b is a detailed view showing power lines of FIG. 2a, and FIG. 2c is a schematic vertical sectional view showing a contact portion between the first metal line and the second metal line of FIG. 2a.

Referring to FIG. 2a, there are shown bit lines BL, first power lines PW1, main read word lines WLR, main write word lines WLW and second power lines PW2.

The first power lines PW1 are formed of a first metal line in a first direction, for example, in a Y-axis direction. The bit lines BL are also formed of the first metal line in the first direction. Each of the first power lines PW1 is disposed between the bit lines BL.

The main read word lines WLR, the main write word lines WLW and the second power lines PW2 are formed of a second metal line in a second direction substantially perpendicular to the first direction, for example, in an X-axis direction.

The main read word line WLR is connected to the memory cell word line WL shown in FIG. 1 and enabled in read operation, such that the access transistors Q1 and Q2 are turned on to select a memory cell to be accessed.

Similarly to the main read word line WLR, the main write word line WLW is connected to the memory cell word line WL and enabled in write operation, such that the access transistors Q1 and Q2 are turn on to select a memory cell to be accessed.

The second power lines PW2 are the second metal lines disposed substantially in parallel with the second direction substantially perpendicular to the first direction. The first power line PW1 and the second power line PW2 contact each other at an intersection CONT1 therebetween, as shown in FIG. 2c.

The second power line PW2 and the main word lines WLR and WLW are formed of the second metal line. The main read word line WLR may be disposed as a first layer, the main write word line WLW hereon and the second power line PW2 over the main write word line WLW. The main write word line WLW and the main read word line WLR may be reversed, wherein the main read word line WLR is disposed on the main write word line WLW and the second power line PW2 disposed on the main read word line WLR.

FIG. 2b shows a connection between power supply voltages VDDs and ground voltages VSSs in the second power line PW1 and the second power line PW2. That is, the power supply voltage VDD is connected to form a path to the power supply voltage VDD (as indicated by 21) and the ground voltage VSS is connected to form a path to the ground voltage VSS (as indicated by 22).

FIG. 2c shows a vertical section of a first metal line MET1 and a second metal line MET2 at a contact portion therebetween, e.g., of the first power line formed of the first metal line MET1 and the second power line formed of the second metal line MET2 at an intersection therebetween. The first power line and the second power line are interconnected by a via layer VIA1. The via layer VIA1 may be formed of a metal (e.g., aluminum) having desirable conductivity.

Figure 3A:
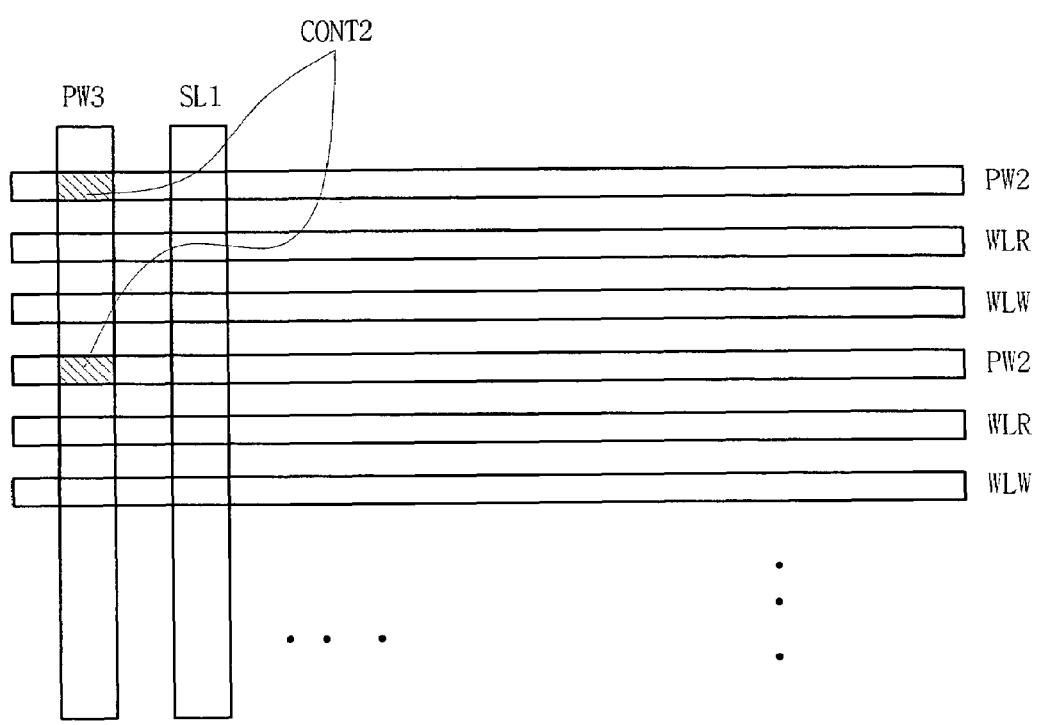
Figure 3B:
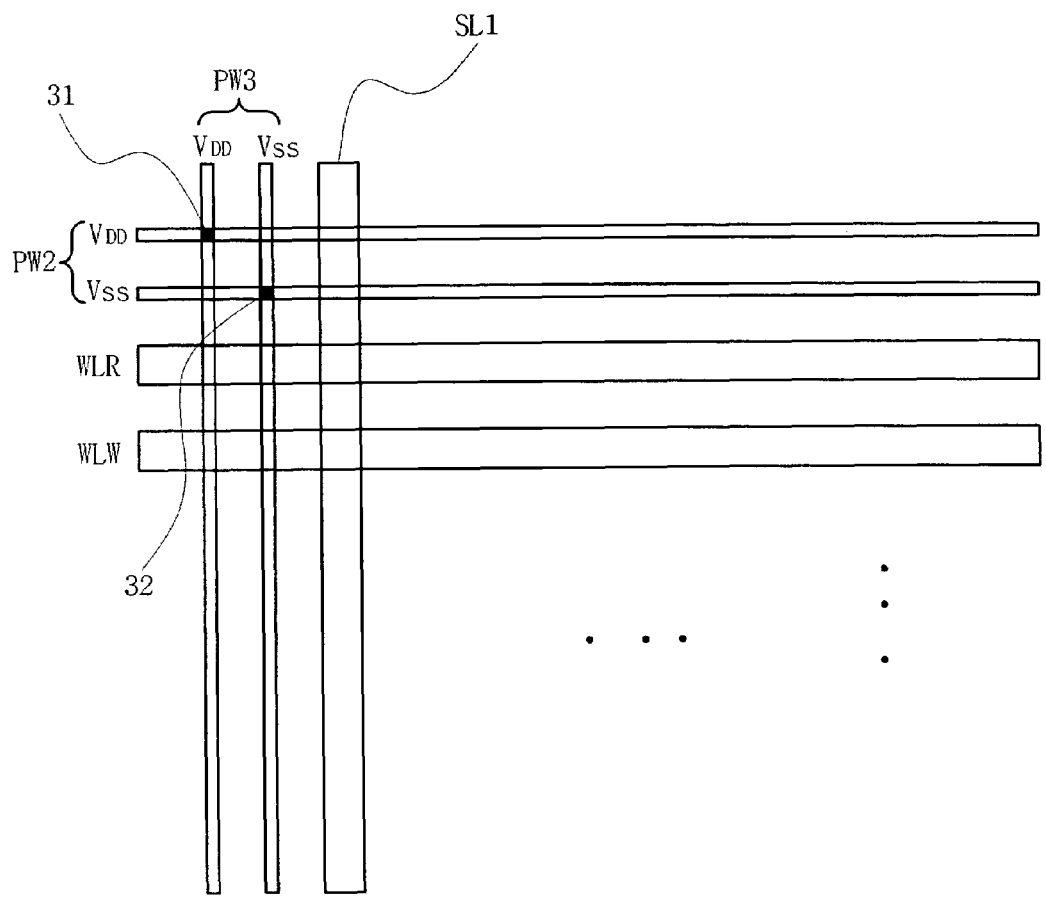

FIG. 3a is a schematic view showing that third metal lines are disposed substantially perpendicular to the second metal lines at an upper portion of FIG. 2a. FIG. 3b is a detailed view of power lines of FIG. 3a, and FIG. 3c is a schematic vertical sectional view showing a contact portion between a second metal line and a third metal line of FIG. 3a.

Referring to FIG. 3a, there are shown second power lines PW2, main read word lines WLR and main write word lines WLW formed of the second metal line, and a third power line PW3 and a first signal line SL1 formed of a third metal line. The first signal line SL1 is for conveying signals such as, for example, a chip select (CS) signal, a write enable (WE) signal, and bit select signals UB and LB. The third power line PW3 is brought in contact with the second power line PW2 at an intersection (CONT2) therebetween.

FIG. 3b shows a detailed contact portion. A power supply voltage VDD of the second power line PW2 is connected to form a path to the power supply voltage VDD of the third power line PW3 (as indicated by 31) and a ground voltage VSS of the second power line PW2 is connected to form a path to the ground voltage VSS of the third power line PW3 (as indicated by 32).

Figure 3C:
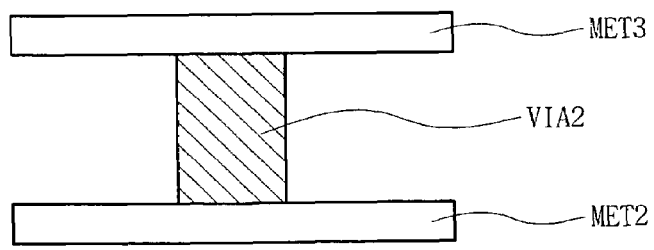

FIG. 3c shows a vertical section of a second metal line MET2 and a third metal line MET3 at a contact portion therebetween, e.g., of the second power line formed of the second metal line MET2 and the third power line formed of the third metal line MET3 at an intersection therebetween. The second power line and the third power line are interconnected by a via layer VIA2. The via layer VIA2 may be formed of a metal (e.g., aluminum) having desirable conductivity.

Figure 4A:
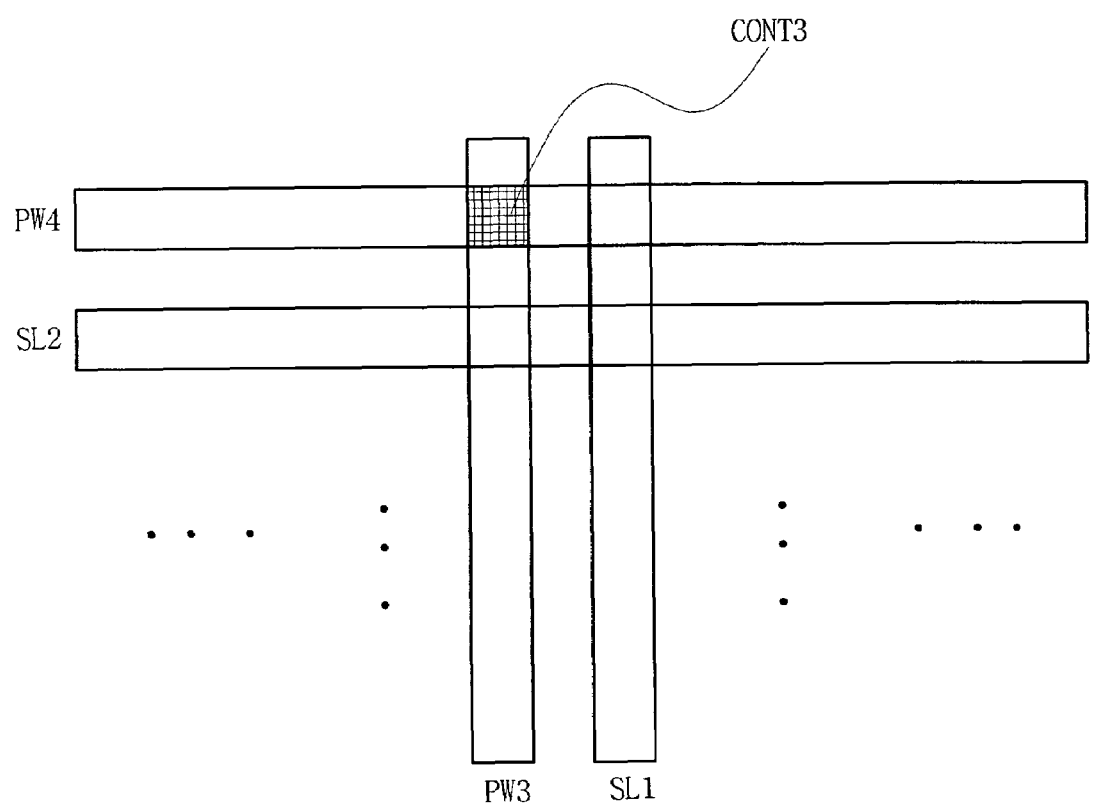
Figure 4B:
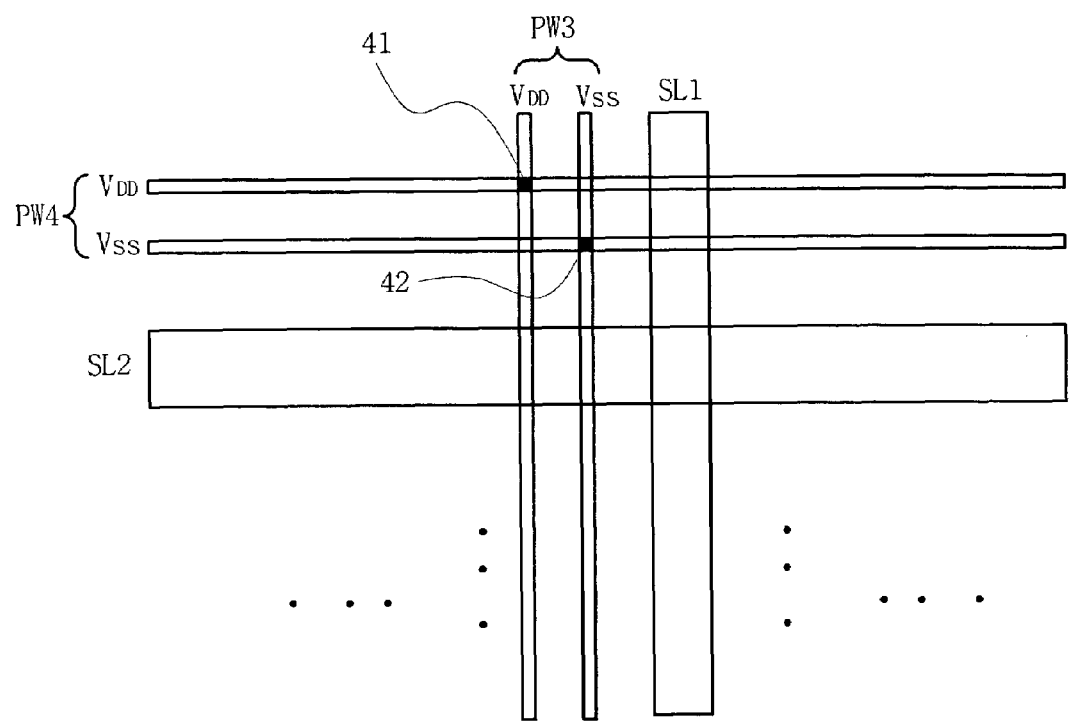

FIG. 4a is a schematic view showing fourth metal lines disposed substantially perpendicular to a third metal lines at an upper portion of FIG. 3a. FIG. 4b is a detailed view of power lines of FIG. 4a, and FIG. 4c is a schematic vertical sectional view showing a contact portion between a third metal line and a fourth metal line of FIG. 4a.

Referring to FIG. 4a, there are shown a third power line PW3 and a first signal line SL1 formed of a third metal line, and a fourth power line PW4 and a second signal line SL2 formed of a fourth metal line. The second signal line SL2 is conveys signals such as, for example, a chip select (CS) signal, a write enable (WE) signal, bit select signals UB and LB, and the like. The fourth power line PW4 is coupled to the third power line PW3 at an intersection (CONT3) therebetween.

FIG. 4b shows a detailed contact portion. A power supply voltage VDD of the third power line PW3 is connected to form a path to the power supply voltage VDD of the forth power line PW4 (as indicated by 41) and a ground voltage VSS of the third power line PW3 is connected to form a path to the ground voltage VSS of the forth power line PW4 (as indicated by 42).

Figure 4C:
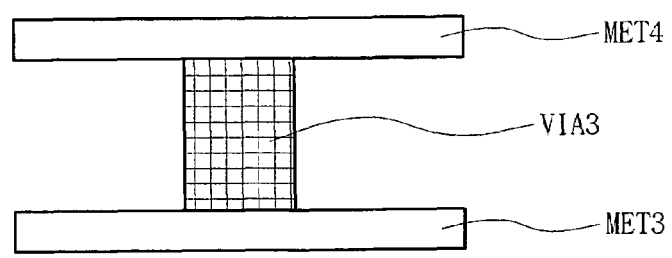

FIG. 4c shows a vertical section of a third metal line MET3 and a fourth metal line MET4 at a contact portion therebetween, e.g., of the third power line formed of the third metal line MET3 and the fourth power line formed of the fourth metal line MET4 at an intersection therebetween. The third power line and the fourth power line are interconnected by a via layer VIA3. The via layer VIA3 may be formed of a metal (e.g., aluminum) having desirable conductivity.

Figure 5A:
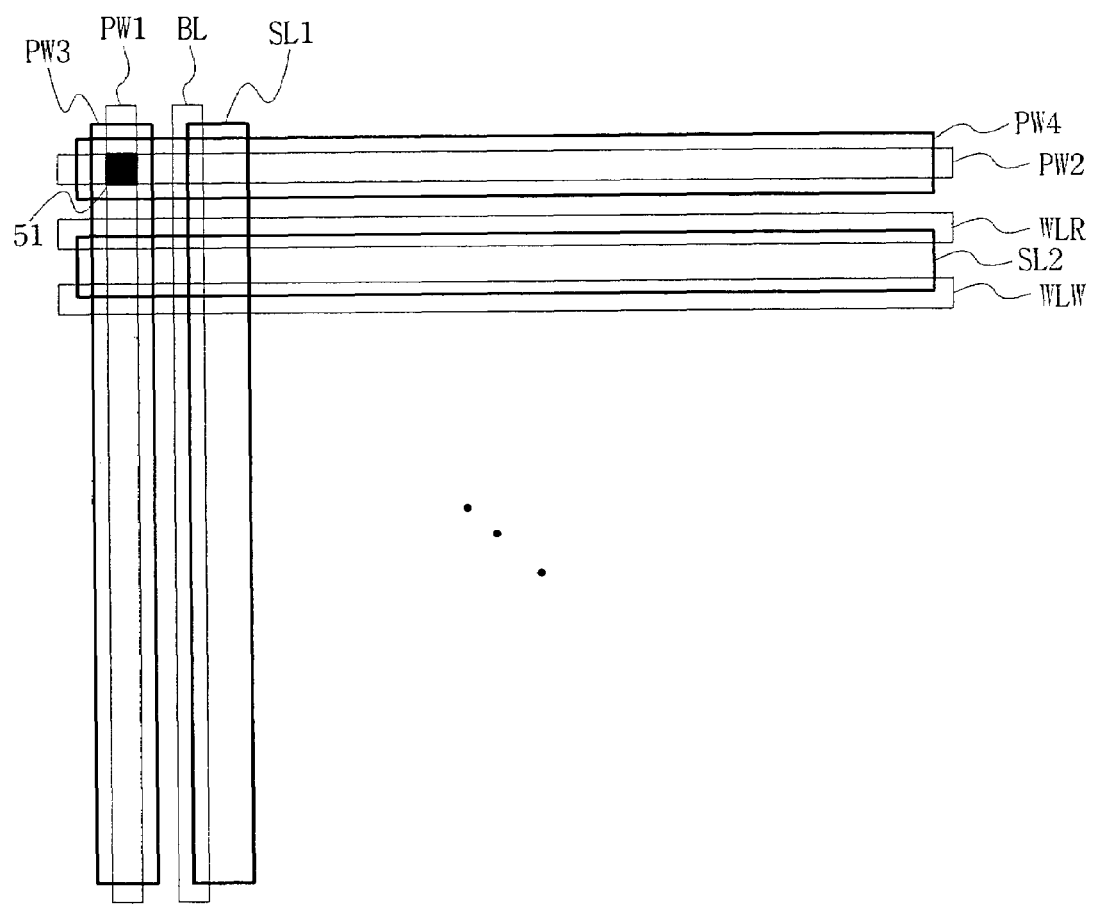
FIG. 5a is a schematic line layout structure view of an upper portion of a cell array of a semiconductor memory device showing that all the metal lines of FIGS. 2a to 4a are disposed.

FIG. 5a is a schematic line layout structure view of an upper portion of a cell array of a semiconductor memory device showing a disposition of the metal lines of FIGS. 2a to 4a, and FIG. 5b is a vertical sectional view showing the vertical structure of FIG. 5a.

Figure 5B:
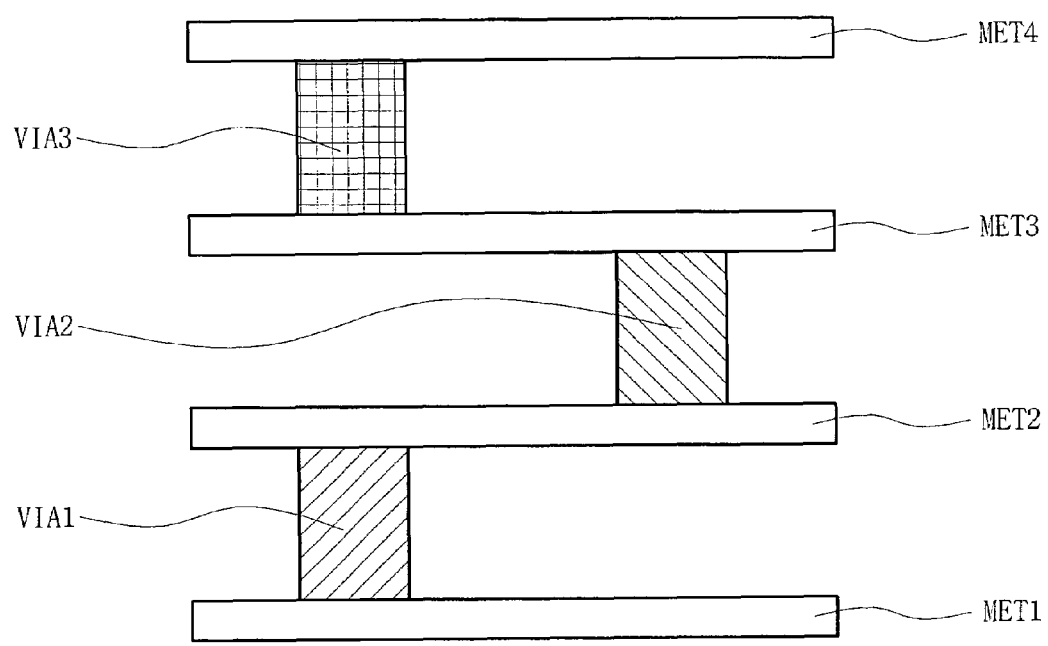

Referring to FIGS. 5a to 5b, a contact 51 between the first power line and the second power line, between the second power line and the third power line, or between the third power line and the fourth power line, is made by a connection through the via layer VIA1, VIA2 or VIA3.

Contact portions between the power lines, i.e., the via layers VIA1, VIA2 and VIA3, may be staggered as shown in FIG. 5b, or may be disposed substantially linearly when viewed in a vertical structure.

Although the description has been made by way of example in connection with forming the fourth metal lines, metal line structures in accordance with the present invention may be modified in various forms and applied even when more metal layers are used.

The present invention has been described using preferred exemplary embodiments. However, it is to be understood that the scope of the invention is not limited to disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A line layout structure of a semiconductor memory device having static memory cells, the line layout structure comprising:
    first metal lines disposed in a first direction on a cell array region to form first power lines for supplying power to the static memory cells;
    second metal lines disposed over the first metal lines in a second direction substantially perpendicular to the first metal lines to form second power lines for supplying power to the first power lines;
    third metal lines disposed over the second metal lines to form third power lines for supplying power to the second power lines; and
    fourth metal lines disposed over the third metal lines to form fourth power lines for supplying power to the third power lines.

2. The line layout structure according to claim 1, further comprising bit lines of the static memory cells formed of the first metal lines, wherein the bit lines and the first power lines are disposed substantially in parallel with each other.

3. The line layout structure according to claim 1, further comprising main word lines formed of the second metal lines and connected to word lines of the static memory cells, wherein the main word lines and the second power lines are disposed substantially in parallel with each other.

4. The line layout structure according to claim 1, further comprising first signal lines formed of the third metal lines for conveying a signal for gaining access to the static memory cells, wherein the first signal lines and the third power lines are disposed substantially in parallel with each other.

5. The line layout structure according to claim 1, further comprising second signal lines formed of the fourth metal lines for conveying a signal for gaining access to the static memory cells, wherein the second signal lines and the fourth power lines are disposed substantially in parallel with each other.

6. A line layout structure of a semiconductor memory device having static memory cells, the line layout structure comprising:

first metal lines disposed in a first direction on a cell array region to form first power lines for supplying power to the static memory cells;

second metal lines disposed over the first metal lines in a second direction substantially perpendicular to the first metal lines to form second power lines for supplying power to the first power lines;

third metal lines disposed over the second metal lines in the first direction to form third power lines for supplying power to the second power lines; and fourth metal lines disposed over the third metal lines in the second direction to form fourth power lines for supplying power to the third power lines.

7. The line layout structure according to claim 6, further comprising bit lines of the static memory cells formed of the first metal line, wherein the bit lines and the first power lines are disposed substantially in parallel with each other.

8. The line layout structure according to claim 6, further comprising main word lines formed of the second metal lines and connected to the word lines of the static memory cells, wherein the main word lines and the second power lines are disposed substantially in parallel with each other.

9. The line layout structure according to claim 8, wherein each main word line includes a main read word line and a main write word line.

10. The line layout structure according to claim 9, wherein the second metal lines are formed to be disposed in an order of the main read word line, the main write word line and the first power line.

11. The line layout structure according to claim 9, wherein the second metal lines are formed to be disposed in an order of the main write word line, the main read word line and the first power line.

12. The structure according to claim 6, further comprising first signal lines formed of the third metal lines for conveying a signal for gaining access to the static memory cells, wherein the first signal lines and the third power lines are disposed substantially in parallel with each other.

13. The line layout structure according to claim 6, further comprising second signal lines formed of the fourth metal lines for conveying a signal for gaining access to the static memory cells, wherein the second signal lines and the fourth power lines are disposed substantially in parallel with each other.

14. The line layout structure according to claim 6, wherein each second power line is coupled to a respective first power line at an intersection therebetween.

15. The line layout structure according to claim 6, wherein each third power line is coupled to a respective second power line at an intersection therebetween.

16. The line layout structure according to claim 6, wherein each fourth power line is coupled to a respective third power line at an intersection therebetween.

17. A line layout structure of a semiconductor memory device having static memory cells, the line layout structure comprising:

first metal lines disposed substantially in parallel with bit lines of the static memory cells on a cell array region, and the first metal lines forming first power lines, the bit lines and the first power lines for supplying power to the memory cells;

second metal lines disposed over the first metal lines substantially in parallel with main word lines connected to word lines of the static memory cells, the second metal lines forming second power lines, the main word lines and the second power lines for supplying power to the static memory cells, the second power lines being coupled to the first power lines at respective intersections therebetween;

third metal lines disposed over the second metal lines to form first signal lines for conveying a signal for gaining access to the static memory cells and third power lines for supplying power to the static memory cells, the third metal lines being disposed substantially perpendicular to the second metal lines and the third power lines being coupled to the second power lines at respective intersections therebetween; and fourth metal lines disposed over the third metal lines to form second signal lines for conveying a signal for gaining access to the static memory cells and fourth power lines for supplying power to the static memory cells, the fourth metal lines being disposed substantially perpendicular to the third metal lines, and the fourth power lines being coupled to the third power lines at respective intersections therebetween.

18. The line layout structure according to claim 17, wherein the first to fourth power lines are coupled with each other through via layers between the respective power lines at an intersection therebetween.

19. The line layout structure according to claim 18, wherein the via layers are disposed substantially linearly when viewed in a vertical structure.

\* \* \* \* \*